(12) United States Patent
Edward et al.

(10) Patent No.: US 8,136,577 B2
(45) Date of Patent: Mar. 20, 2012

(54) METHOD AND APPARATUS FOR DISSIPATING HEAT, AND RADAR ANTENNA CONTAINING HEAT DISSIPATING APPARATUS

(75) Inventors: Brian J Edward, Jamesville, NY (US); Mark Sabatino, Jamesville, NY (US); Peter J Ruzicka, Auburn, NY (US)

(73) Assignee: Sensis Corporation, East Syracuse, NY (US)

( * ) Notice: Subject to any disclaimer, the term of this patent is extended or adjusted under 35 U.S.C. 154(b) by 801 days.

(21) Appl. No.: 11/442,010

(22) Filed: May 26, 2006

(65) Prior Publication Data
US 2006/0268518 A1    Nov. 30, 2006

Related U.S. Application Data

(60) Provisional application No. 60/686,006, filed on May 31, 2005.

(51) Int. Cl.
*F28F 7/00* (2006.01)
*H05K 7/20* (2006.01)

(52) U.S. Cl. ...................................... 165/80.3; 165/185

(58) Field of Classification Search ................ 165/80.3, 165/80.1, 185, 104.34; 361/696, 697
See application file for complete search history.

(56) References Cited

U.S. PATENT DOCUMENTS

| | | | | |
|---|---|---|---|---|
| 4,463,409 A | * | 7/1984 | Altoz et al. | 361/689 |
| 4,489,363 A | * | 12/1984 | Goldberg | 361/693 |
| 4,835,658 A | * | 5/1989 | Bonnefoy | 361/692 |
| 5,063,476 A | * | 11/1991 | Hamadah et al. | 361/697 |
| 5,592,363 A | * | 1/1997 | Atarashi et al. | 361/689 |
| 5,773,886 A | * | 6/1998 | Rostoker et al. | 257/718 |
| 6,578,625 B1 | * | 6/2003 | Wyatt et al. | 165/80.3 |

* cited by examiner

*Primary Examiner* — Tho V Duong
(74) *Attorney, Agent, or Firm* — Burr & Brown

(57) ABSTRACT

There is provided a heat dissipation device comprising at least one inlet plenum, at least one outlet plenum and chambers, in which the chambers communicate directly with the inlet plenum and with the outlet plenum. Also provided is a heat dissipation device comprising at least two inlet plenums, at least two outlet plenums and at least two chambers, the first chamber communicating directly with a first inlet plenum and a first outlet plenum, the second chamber communicating directly with a second inlet plenum and a second outlet plenum. Also provided are methods of dissipating heat, comprising passing fluid across and/or through such devices. Also provided are radar antennas comprising radar electronic components mounted on such devices.

32 Claims, 4 Drawing Sheets

METHOD AND APPARATUS FOR DISSIPATING HEAT, AND RADAR ANTENNA CONTAINING HEAT DISSIPATING APPARATUS

CROSS-REFERENCE TO RELATED APPLICATIONS

This application claims the benefit of U.S. Provisional Patent Application No. 60/686,006, filed May 31, 2005, the entirety of which is incorporated herein by reference.

FIELD OF THE INVENTION

The present invention relates to apparatus for dissipating heat. The present invention further relates to the thermal management of electronic components, and more particularly, limiting temperatures of components generating heat at very high density. The present invention further relates to methods of dissipating heat, e.g., from electronic components.

In preferred aspects, the present invention relates to apparatus for dissipating heat from electronic components, e.g., electronic components for a radar antenna. The present invention further relates to array antenna systems, and more particularly, tile-construct active phased array systems having forced air cooling.

BACKGROUND OF THE INVENTION

Evolving electronic components are operating at higher speeds and higher power levels and are being packed more and more densely. As a consequence, these components are generating increasingly larger amounts of heat in smaller areas. To limit the temperatures of these components, and thereby realize peak performance plus reliable operation, this heat energy must be effectively removed.

The continued trend in digital electronic integrated circuits, such as computer processors, is to form more active devices (transistors) into smaller areas and to operate these devices at higher speeds. The by-product of this trend is the generation of very high heat densities. Removal of this heat has been identified as perhaps the biggest issue facing computer designers. Consequently, to support performance improvements, effective heat extraction techniques are essential. New transistor materials, such as silicon carbide, are being developed for both analog power and radio frequency (RF) devices. These materials enable generation, conversion, and management of much higher power levels than has been previously possible. Heat densities at the point of generation can be on the order of 7000 Watts per square millimeter peak, ten times the amount associated with current transistors. To fully realize the potential of these new material components, effective heat removal techniques are needed.

Opto-electronic components, such as laser diodes and photo-detectors, must be maintained within temperature bounds to operate properly. As their power levels increase, techniques for removal of their excess heat, so as to maintain preferred operational temperatures, are essential.

Next generation radar systems will be required to deliver high levels of performance and operational flexibility, feature exceptional reliability, and be amenable to growth in capability while being readily integrated into their host platforms. Active phased arrays afford significant radar performance capability while "tile" construct implementations yield minimum volume and weight systems, and effective air-cooling promotes reliable operation.

Phased arrays are configured from a plurality of individual radiating elements whose phase and amplitude states can be electronically controlled. The radiated energy from the collection of elements combines constructively (focused) so as to form a beam. The angular position of the beam is electronically redirected by controlling the elements' phases. The shape of the beam is altered by controlling both the elements' phases and amplitudes. Active phased array antennas include the initial low noise amplifier for receive and the final power amplifier for transmit with each individual radiator, in addition to the phase and amplitude control circuitry. These components are packaged into Transmit/Receive (T/R) modules and are distributed, with the radiating elements, over the array structure.

Tile array implementations package the phased array active circuits into low-profile modules which are disposed in a plane parallel to the radiating face of the array. This is in contrast to "brick" constructs which package the circuitry into higher profile modules which are disposed orthogonal to the face of the array. Tile construction yields relatively thin and hence low volume active phased arrays which are more readily adapted to the host platforms. The construction also results in minimizing weight, which is universally beneficial for all platforms.

BRIEF SUMMARY OF THE INVENTION

In accordance with a first aspect of the present invention, there is provided a heat dissipation device comprising at least a first inlet plenum, at least a first outlet plenum, a plurality of first plenum heat transfer elements and a plurality of first plenum heat transfer chambers, each first plenum heat transfer chamber communicating directly with the first inlet plenum on a first side of the first plenum heat transfer chamber and communicating directly with the first outlet plenum on a second side of the first plenum heat transfer chamber, at least one of the first plenum heat transfer elements being positioned in each heat transfer chamber.

In accordance with a second aspect of the present invention, there is provided a heat dissipation device comprising at least first and second inlet plenums, at least first and second outlet plenums, at least first and second heat transfer chambers, and a plurality of heat transfer elements, the first heat transfer chamber communicating directly with the first inlet plenum on a first side of the first heat transfer chamber and with the first outlet plenum on a second side of the first heat transfer chamber, the second heat transfer chamber communicating directly with the second inlet plenum on a first side of the second heat transfer chamber and communicating directly with the second outlet plenum on a second side of the second heat transfer chamber, at least one heat transfer element being positioned in each heat transfer chamber.

The present invention is further directed to methods of dissipating heat, comprising passing fluid (preferably gaseous, a particularly preferred fluid being air) through inlet plenums, through heat transfer elements, and through outlet plenums of devices according to the first aspect of the present invention or devices according to the second aspect of the present invention as described above.

The present invention is further directed to a radar antenna comprising radar electronic components mounted on a device according to the first aspect of the present invention or on a device according to the second aspect of the present invention.

In another aspect, the present invention provides a tile-construct phased array which incorporates an air-cooling thermal management system integral to the array structure.

Preferably, the tile-construct phased array supplies fresh cooling air to each T/R module, unheated by neighboring units, to effectively limit component temperatures to acceptable values and yield a uniform temperature over the array. Such an approach promotes reliable and high performance active array operation. The use of air cooling additionally minimizes the overhead power that is consumed by the thermal management system. The tile construct approach described herein can provide convenient access to the T/R modules. These units can be removed and replaced, potentially with higher transmit power modules to promote radar system capability growth. The air-cooling design fully supports management of the increased thermal loads associated with such high power units.

The invention may be more fully understood with reference to the accompanying drawings and the following detailed description of the invention.

BRIEF DESCRIPTION OF THE DRAWING FIGURES

Figure 6:
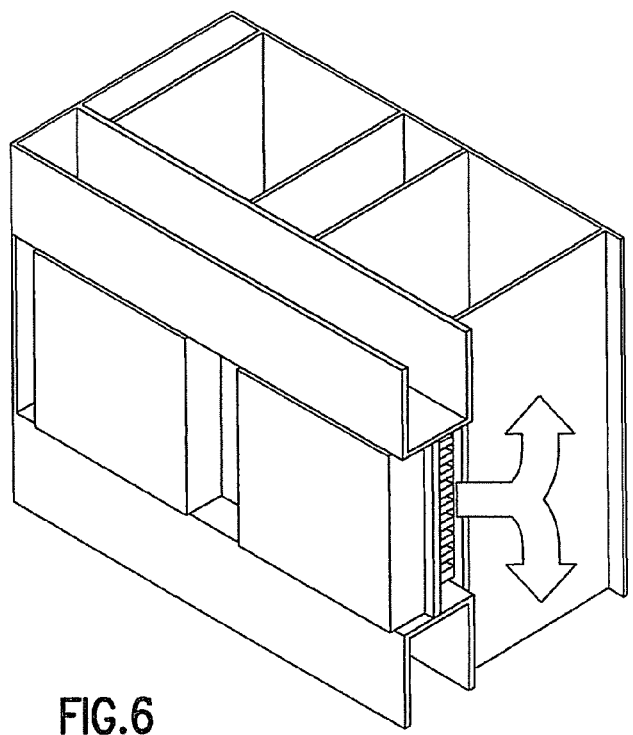

FIG. 6 displays an air flow path as it exits heat sink module extended surfaces and enters an exhaust air channel in an embodiment according to the present invention.

Figure 7:
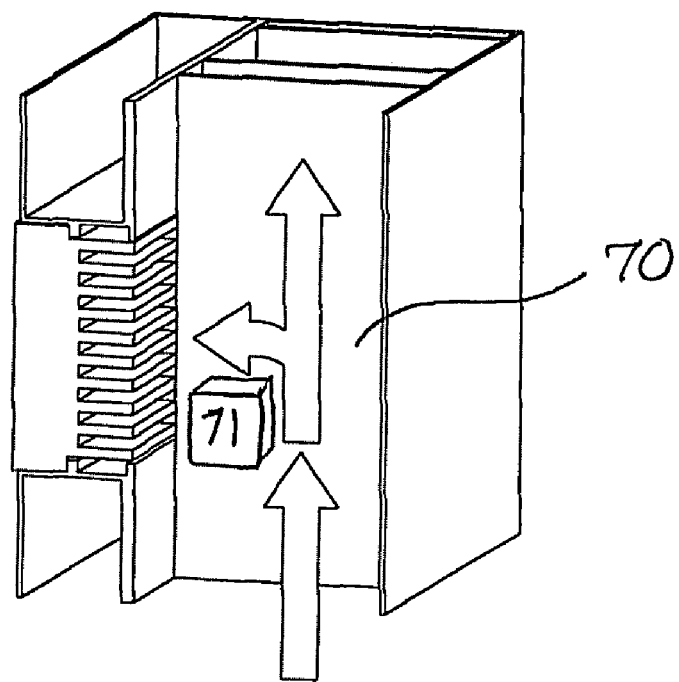

FIG. 7 is a schematic representation of a portion of a heat dissipation device according to the present invention.

DETAILED DESCRIPTION OF THE INVENTION

The expression "extends in a first direction" when referring to a particular element, e.g., a plenum, indicates that a line can be drawn in the first direction which passes through that element (preferably, which is co-linear with an axis of that element).

The expression "fin" as used herein refers to a protrusion having two major dimensions and one minor dimension, preferably a structure which includes first and second substantially parallel sides.

As used herein, the term "substantially," e.g., in the expressions "substantially parallel", and "substantially in a plane", means at least about 90% correspondence (preferably 95% correspondence) with the feature recited, e.g., "substantially parallel" means that two planes diverge from each other at most by an angle of 10% of 90 degrees, i.e., 9 degrees (preferably 4.5 degrees); "substantially in a plane" means that a plane defined by any trio of points in the structure and a plane connecting any other trio of points in the structure define no angle greater than 10% of 90 degrees, i.e., 9 degrees (preferably 4.5 degrees).

The expression "substantially perpendicular", as used herein, means that at least 90% (preferably 95%) of the points in the structure which is characterized as being substantially perpendicular to a reference plane are located on one of or between a pair of planes (1) which are perpendicular to the reference plane, (2) which are parallel to each other and (3) which are spaced from each other by a distance of not more than 10% (preferably 5%) of the largest dimension of the structure.

As mentioned above, in accordance with a first aspect of the present invention, there is provided a heat dissipation device comprising at least a first inlet plenum, at least a first outlet plenum, a plurality of first plenum heat transfer elements and a plurality of first plenum heat transfer chambers.

Preferably, in heat dissipation devices according to the first aspect of the present invention, each first plenum heat transfer chamber communicates directly with the first inlet plenum on a first side of the first plenum heat transfer chamber and communicates directly with the first outlet plenum on a second side of the first plenum heat transfer chamber.

The expression "communicating directly" as used herein, e.g., in the expression "each first plenum heat transfer chamber communicating directly with the first inlet plenum" indicates that the respective elements, e.g., the first plenum heat transfer chamber and the first outlet plenum are in communication with no heat transfer elements positioned therebetween.

In accordance with this aspect of the present invention, the first inlet plenum and the first outlet plenum, and the walls thereof, can extend in any desired direction or directions relative to one another. Preferably, the first inlet plenum is substantially parallel to the first outlet plenum. Preferably, respective walls of the first inlet plenum are parallel to respective walls of the first outlet plenum.

Any suitable heat transfer elements (which may be the same or different from one another) can be employed in the first aspect of the present invention.

In accordance with the first aspect of the present invention, the heat transfer elements can be placed in any desired orientation in relation to the first inlet plenum. Preferably, each of the heat transfer elements comprises a base and a plurality of protrusions provided on the base, and each of the protrusions extend in directions substantially perpendicular to the direction in which the first inlet plenum extends, and/or each of the protrusions extends from its base toward the first inlet plenum.

Preferably, the heat transfer elements each comprise a base and a plurality of protrusions provided on the base, and at least one electronic component (e.g., an integrated circuit component) is mounted on a side of the base opposite to the side on which the protrusions are provided.

Preferably, the device according to the first aspect of the present invention further comprises at least a second inlet plenum and at least a second outlet plenum as well as a plurality of second plenum heat transfer chambers, each of the second plenum heat transfer chambers communicates directly with the second inlet plenum on a first side of the second plenum heat transfer chamber and communicates directly with the second outlet plenum on a second side of the second plenum heat transfer chamber, and at least one heat transfer device is positioned in each of the second plenum heat transfer chambers.

The device according to the first aspect of the present invention can further comprise at least a second outlet plenum as well as at least one second plenum heat transfer chamber, wherein each of the second plenum heat transfer chambers communicates directly with the first inlet plenum on a first side of the second plenum heat transfer chamber and communicates directly with the second outlet plenum on a second side of the second plenum heat transfer chamber, at least one heat transfer device is positioned in each of the second plenum heat transfer chambers, and the first and second outlet plenums are positioned on opposite sides of the first inlet plenum.

In accordance with the first aspect of the present invention, the number and arrangement of plenums and heat transfer elements is not restricted, and any desired number and arrangement of inlet plenums, outlet plenums and heat transfer elements can be employed. The devices according to the first aspect of the present invention, and the components thereof, can generally be of any desired size and shape.

As mentioned above, in accordance with a second aspect of the present invention, there is provided a heat dissipation device comprising at least first and second inlet plenums, at least first and second outlet plenums, a plurality of heat transfer elements and a plurality of heat transfer chambers.

Preferably, in heat dissipation devices according to the second aspect of the present invention, the first heat transfer chamber communicates directly with the first inlet plenum on a first side of the first heat transfer chamber and with the first outlet plenum on a second side of the first heat transfer chamber, and the second heat transfer chamber communicates directly with the second inlet plenum on a first side of the second heat transfer chamber and communicates directly with the second outlet plenum on a second side of the second heat transfer chamber.

In accordance with this aspect of the present invention, the first inlet plenum, the second inlet plenum, the first outlet plenum, and the second outlet plenum, and the walls thereof, can extend in any desired direction or directions relative to one another. Preferably, the first inlet plenum, the second inlet plenum, the first outlet plenum and the second outlet plenum, are substantially parallel to one another. Preferably, walls of the first inlet plenum, the second inlet plenum, the first outlet plenum and the second outlet plenum are parallel to one another.

Any suitable heat transfer elements (which may be the same or different from one another) can be employed in the second aspect of the present invention.

In accordance with the second aspect of the present invention, the heat transfer elements can be placed in any desired orientation in relation to the respective inlet and outlet plenums. Preferably, each of the heat transfer elements comprises a base and a plurality of protrusions provided on the base, and each of the protrusions extend in directions substantially perpendicular to the direction in which the first and/or second inlet plenum extends, and/or each of the protrusions extends from its base toward the first inlet plenum or the second inlet plenum.

Preferably, the heat transfer elements each comprise a base and a plurality of protrusions provided on the base, and at least one electronic component (e.g., an integrated circuit component) is mounted on a side of the base opposite to the side on which the protrusions are provided.

The device according to the second aspect of the present invention can further comprise one or more heat transfer chambers, each containing at least one heat transfer device, which communicate directly with the first inlet plenum on a first side, communicate directly with the first outlet plenum on a second side, and communicate directly with the second outlet plenum on a third side, wherein the first and second outlet plenums are positioned on opposite sides of the first inlet plenum.

In accordance with the second aspect of the present invention, the number and arrangement of inlet plenums, outlet plenums and heat transfer elements is not restricted, and any desired number and arrangement of plenums in the heat transfer elements can be employed. The devices according to the second aspect of the present invention, and the components thereof, can generally be of any desired size and shape.

The present invention is further directed to methods of dissipating heat, comprising passing fluid (preferably gaseous, a particularly preferred fluid being air) through heat transfer chambers of devices according to the first aspect of the present invention as discussed above.

The present invention is further directed to methods of dissipating heat, comprising passing fluid (preferably gaseous, a particularly preferred fluid being air) through heat transfer chambers of devices according to the second aspect of the present invention as discussed above.

As noted above, the present invention is further directed to a radar antenna comprising radar electronic components mounted on a device according to the first aspect of the present invention, or on a device according to the second aspect of the present invention.

The invention provides devices which provide ways to supply ambient air feed from upstream air movers. In an embodiment which provides such feature, air is heated only by the thermal dissipation of the air movers and energy from mechanical stirring. The near ambient temperature air passes through each heat sink module without being pre-heated by passing through another module or by air from adjacent modules. This provides the maximum temperature differential between the air and the heated surface, thereby promoting more effective heat transfer.

Figure 4:
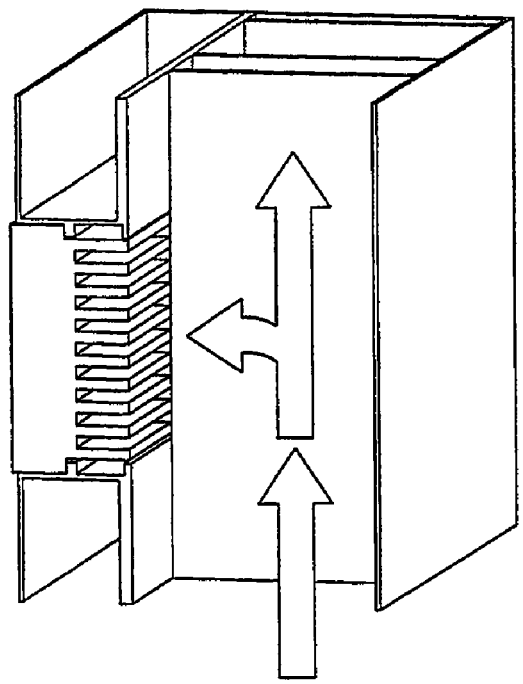
FIG. 4 shows the path of air flow through a main feed column of an embodiment of a heat dissipation device according to the present invention, and how air is divided through the heat sink module and continuing air flow for distribution to other heat sink modules downstream.

FIG. 4 shows the path of the air flow through the main feed column of an embodiment of a heat dissipation device according to the present invention, and how it divides into air that passes through the heat sink module extended surfaces and the continuing air flow for distribution to other heat sink modules downstream. This column is pressurized by the blowers and flow impinges upon the heat sink module extended surfaces. The path of flow is from the ends of the extended surfaces towards the base and is directed and channeled to exit out of the sides of the extended surface region of the heat sink module. The geometry of the extended surface does not necessarily need to be a plate fin configuration—this could be any of a wide variety of geometries as long as air flow is channeled and directed as shown.

Figure 5:
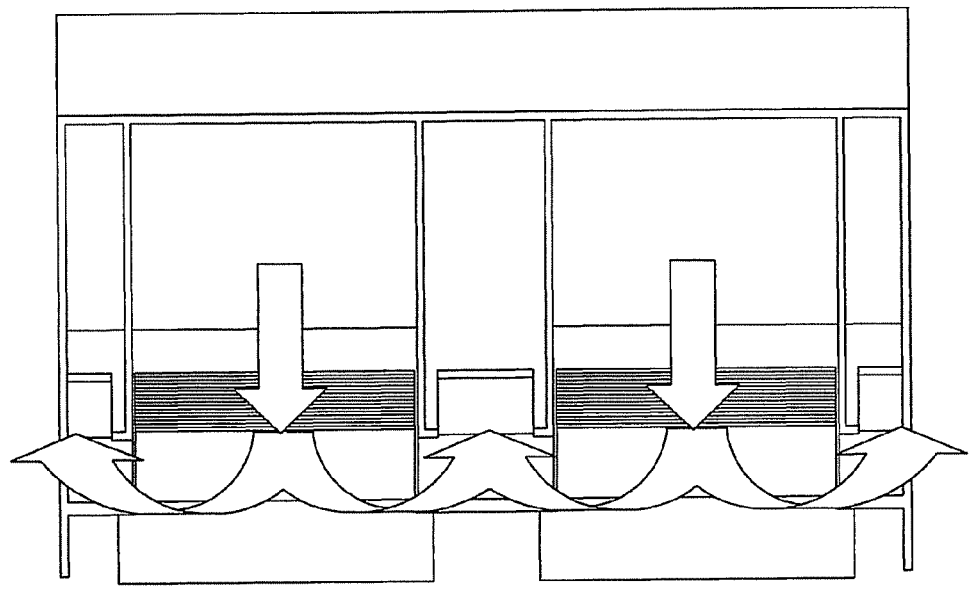
FIG. 5 shows air flow as it exits out of both sides of an embodiment of a heat sink module according to the present invention through channels provided between the extended surfaces of the heat sink module.

FIG. 5 shows the path of air flow as it exits out of both sides of an embodiment of a heat sink module extended surface region and flows through the channeled paths provided between the extended surfaces of the heat sink module.

FIG. 6 displays an air flow path as it exits a heat sink module extended surface region and enters the exhaust air channel of an embodiment according to the present invention. This flow is free to divert in either direction or split to both directions depending on its location to other heat sink modules and the pressure at the exits.

The heat transfer is accomplished by the mass air flow rate passing through each of the individual heat sink modules, supplied by and flowing through the air feed columns. Long air-feed columns of over a few modules in length will require air metering at the individual heat sink modules to accommodate for the pressure drop as the air flows along the feed column and is distributed to each heat sink module along the length of the feed column. This metering can be provided by metering or orifice plates at each location to provide air flow control.

FIG. 7 is a schematic representation of a portion of a heat dissipation device according to the present invention. FIG. 7 schematically depicts a feed column 70 and a metering plate 71.

Figure 1:
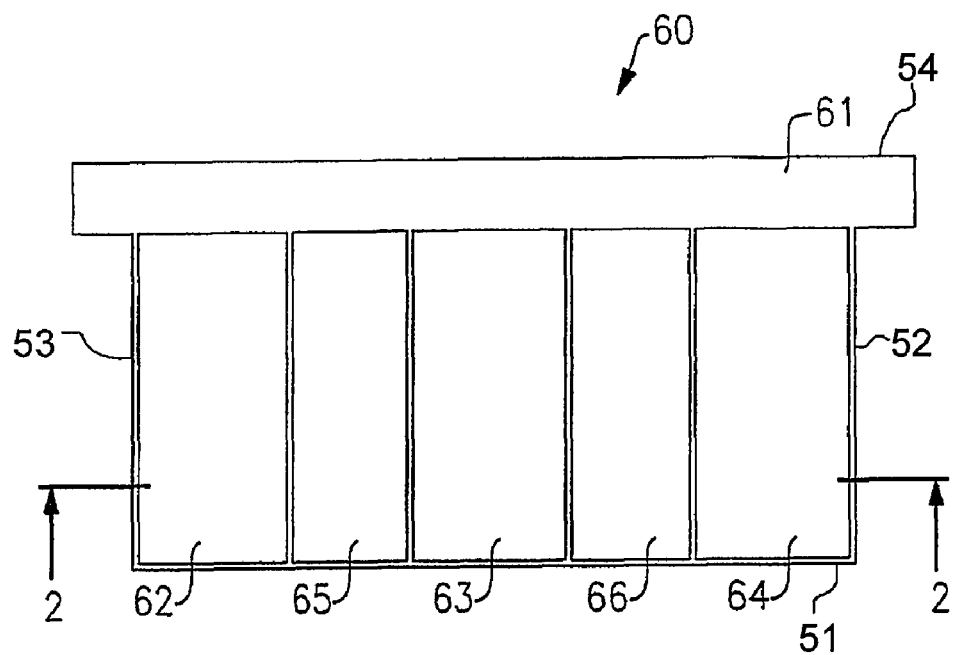
FIG. 1 is a bottom view of a heat dissipation device according to a first embodiment in accordance with the present invention.
Figure 2:
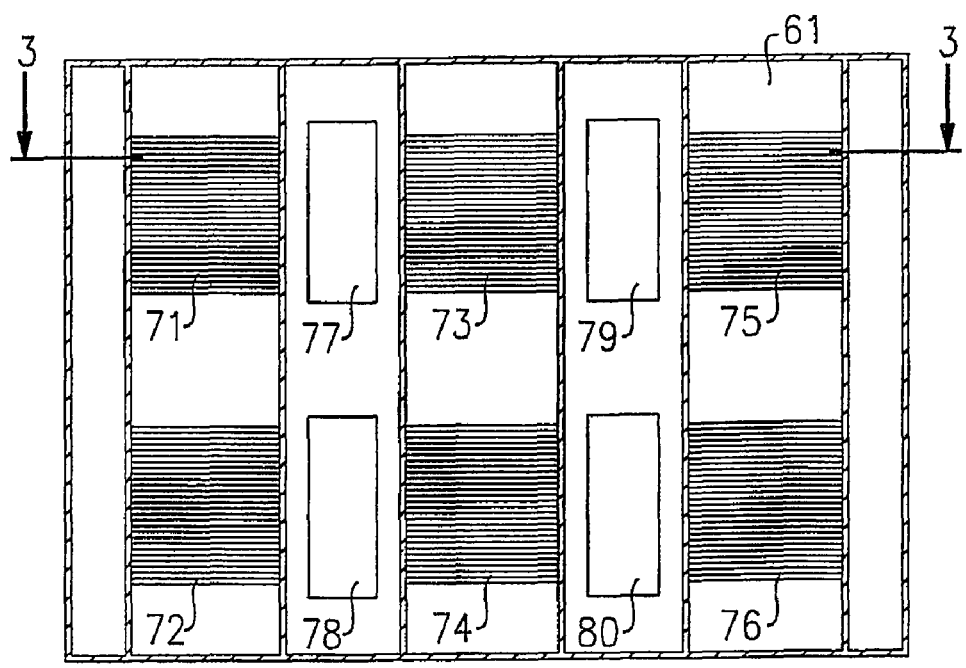
FIG. 2 is a cross-sectional view taken along line 2-2 in FIG. 1

A first embodiment of a heat dissipation device according to the present invention is depicted in FIGS. 1-2. This embodiment corresponds with the first and second aspects of the present invention as discussed above.

FIG. 1 is a bottom view of the heat dissipation device 60 according to the first embodiment. The heat dissipation device 60 comprises a housing 61 which defines a first inlet plenum 62, a second inlet plenum 63, a third inlet plenum 64, a first outlet plenum 65 and a second outlet plenum 66.

The inlet plenums can each include a separate fluid supply device, e.g., a fan or pump, for supplying fluid into each such plenum, or, alternatively, one or more of the inlet plenums can be supplied with fluid from a manifold which includes one or more fluid supply devices, e.g., fans or pumps.

FIG. 2 is a cross-sectional view of the heat dissipation device 60 taken along line 2-2 in FIG. 1. FIG. 2 shows heat transfer elements 71-76, each positioned in a respective heat transfer chamber formed in the housing 61. FIG. 2 also depicts heat transfer chamber outlets 77-80 also formed in the housing 61.

Figure 3:
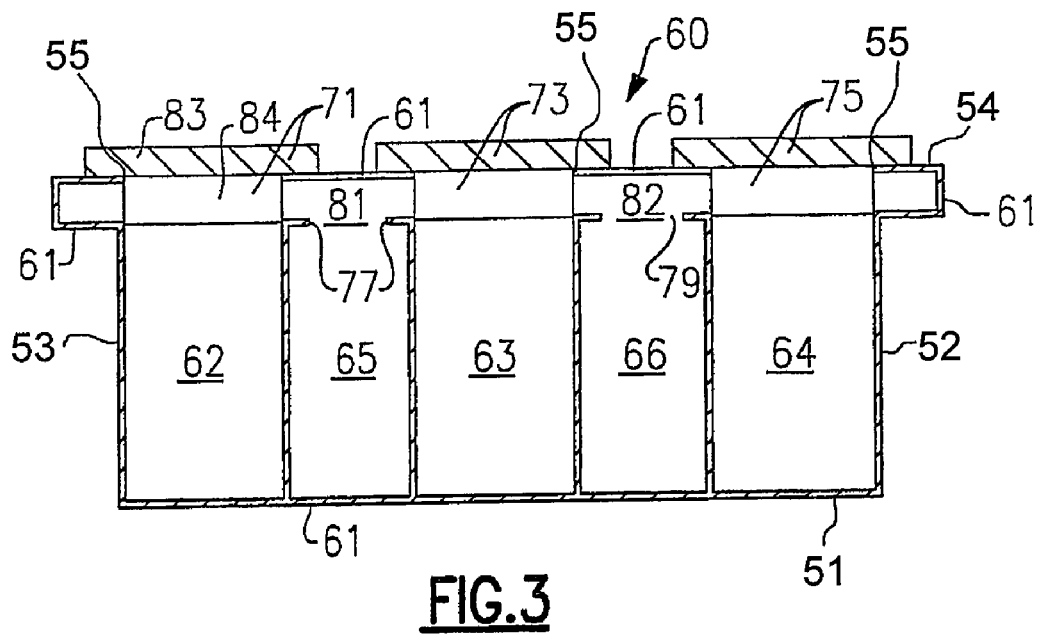
FIG. 3 is a cross-sectional view taken along line 3-3 in FIG. 2

FIG. 3 is a cross-sectional view of the heating dissipation device 60 taken along line 3-3 in FIG. 2. FIG. 3 depicts a first outlet plenum conduit 81 and a second outlet plenum conduit 82. The heat transfer elements each include a base and a plurality of fins (e.g., as shown in FIG. 3), the first heat transfer element 71 includes a base 83 and a plurality of fins, including a fin 84). Housing 61 includes a first wall 51, side walls 52 and 53 and back wall 54 as shown in FIGS. 1 and 3. Each inlet plenum 62-64 interfaces with a heat transfer element 71, 73 and 75, respectively, as shown in FIG. 3. The base and fins of each of heat transfer elements 71, 73 and 75 extends through an opening 55 in the back wall 54 of housing 61, as shown in FIG. 3.

As can be seen from FIGS. 2 and 3, fluid supplied through the first inlet plenum 62 passes across the fins of the heat transfer element 71 (the heat transfer element 71 comprises a base 83 and fins 84), through the first outlet plenum conduit 81, through the heat transfer chamber outlet 77 and into the first outlet plenum 65, through which it exits the heat dissipation device 60. Similarly, a first portion of fluid from the second inlet plenum 63 passes across the fins of the heat transfer element 73, through the outlet plenum conduit 81 and through the heat transfer chamber outlet 77 into the first outlet plenum 65, through which it exits the heat dissipation device 60; a second portion of fluid from the second inlet plenum 63 passes across the fins of the heat transfer element 73, through the outlet plenum conduit 82, through the heat transfer chamber outlet 79 and into the second outlet plenum 66, through which it exits the heat dissipation device 60. Similarly, fluid from the third inlet plenum 64 passes across the fins of the heat transfer element 75, through the outlet plenum conduit 82, through the heat transfer chamber outlet 79 and into the second outlet plenum 66, through which it exits the heat dissipation device 60.

In an analogous way, fluid passes from the first inlet plenum 62, across the fins of the heat transfer element 72, through an outlet plenum conduit (not visible in FIG. 3), then through the heat transfer chamber outlet 78 into the first outlet plenum 65, through which it exits the heat dissipation device 60; fluid passes from the second inlet plenum 63 across the fins of the heat transfer element 74, and respective portions thereof pass through outlet plenum conduits (not visible in FIG. 3) and then through the heat transfer chamber outlets 78 and 80, respectively, into the first outlet plenum 65 and the second outlet plenum 66, through which it exits the heat dissipation device 60, respectively; and fluid passes from the third inlet plenum 64, across the fins of the heat transfer element 76, through an outlet plenum conduit (not visible in FIG. 3), through the heat transfer chamber outlet 80 and into the second outlet plenum 66, through which it exits the heat dissipation device 60.

Although the first embodiment shown in FIGS. 1-3 includes only first, second and third inlet plenums and first and second outlet plenums, devices according to the first and/or second aspects of the present invention can include any number of inlet and outlet plenums, whereby, e.g., respective portions of fluid from the third inlet plenum 64, after passing across the fins of the heat transfer element 75 could be directed either to the left and to the right from the perspective shown in FIG. 3, i.e., through the outlet plenum conduit 82 and through another outlet plenum conduit on an opposite side of the fins of the heat transfer element 75 relative to the outlet plenum conduit 82 and then through a heat transfer chamber outlet and into an additional outlet plenum positioned to the right (from the perspective shown in FIG. 3) of the third inlet plenum 64 shown in FIG. 3.

In such a way, the heat transfer chambers in which the heat transfer elements 71 and 72, respectively, are positioned communicate directly with the first inlet plenum 62 on respective first sides of those heat transfer chambers and communicate directly with the first outlet plenum 65 on respective second sides of those heat transfer chambers. Similarly, in the device depicted in FIGS. 1-3, the heat transfer chambers in which the heat transfer elements 73 and 74 are positioned communicate directly with the second inlet plenum 63 on respective first sides of those heat transfer chambers, communicate with the first outlet plenum 65 on respective second sides of those heat transfer chambers, and communicate with the second outlet plenum 66 on respective third sides of those heat transfer chambers.

Any two or more structural parts of the devices described herein can be integrated. Any structural part of the devices described herein can be provided in two or more parts which are held together, if necessary. Similarly, any two or more functions can be conducted simultaneously, and/or any function can be conducted in a series of steps.

The invention claimed is:

1. A heat dissipation device, comprising:
   a housing, said housing comprising at least a first inlet plenum and at least a first outlet plenum, said housing defining a plurality of first plenum heat transfer chambers, each said first plenum heat transfer chamber communicating directly with said first inlet plenum on a first side of said first plenum heat transfer chamber and communicating directly with said first outlet plenum on a second side of said first plenum heat transfer chamber; and
   at least one heat transfer element positioned in each said heat transfer chamber, each said heat transfer element comprising a base and a plurality of protrusions,
   said housing comprising a housing back wall, said housing back wall defining a plurality of back wall openings, each said heat transfer element being positioned with its base in contact with said housing back wall and its protrusions extending through one of said back wall openings, said base being on one side of said housing back wall and at least a portion of each of said protrusions being on an opposite side of said housing back wall.

2. A device as recited in claim 1, wherein:
   said first inlet plenum extends in a first direction,
   said first outlet plenum extends in a second direction, and
   said first direction is substantially parallel to said second direction.

3. A device as recited in claim 1, wherein:
said first inlet plenum comprises at least a first inlet plenum first wall, a first inlet plenum second wall, a first inlet plenum third wall and a first inlet plenum fourth wall,
said first inlet plenum first wall extends substantially in a first inlet plenum first wall plane,
said first inlet plenum second wall extends substantially in a first inlet plenum second wall plane,
said first inlet plenum third wall extends substantially in a first inlet plenum third wall plane,
said first inlet plenum fourth wall extends substantially in a first inlet plenum fourth wall plane,
said first outlet plenum comprises at least a first outlet plenum first wall, a first outlet plenum second wall, a first outlet plenum third wall and a first outlet plenum fourth wall,
said first outlet plenum first wall extends substantially in a first outlet plenum first wall plane,
said first outlet plenum second wall extends substantially in a first outlet plenum second wall plane,
said first outlet plenum third wall extends substantially in a first outlet plenum third wall plane,
said first outlet plenum fourth wall extends substantially in a first outlet plenum fourth wall plane,
said first inlet plenum first wall is substantially parallel to said first outlet plenum first wall,
said first inlet plenum second wall is substantially parallel to said first outlet plenum second wall,
said first inlet plenum third wall is substantially parallel to said first outlet plenum third wall, and
said first inlet plenum fourth wall is substantially parallel to said first outlet plenum fourth wall.

4. A device as recited in claim 1, wherein each of said plurality of protrusions comprises a fin.

5. A device as recited in claim 1, wherein:
said first inlet plenum extends in a first direction, and
each of said protrusions extends in a direction substantially perpendicular to said first direction.

6. A device as recited in claim 1, wherein:
each of said protrusions extends from said base toward said first inlet plenum.

7. A device as recited in claim 1, wherein:
said base has a base first side and a base second side,
said protrusions extend from said base first side, and
at least one electronic component is mounted on said base second side.

8. A device as recited in claim 1, wherein:
said device further comprises:
    at least a second inlet plenum and at least a second outlet plenum; and
    a plurality of second plenum heat transfer chambers,
each of said second plenum heat transfer chambers communicates directly with said second inlet plenum on a first side of said second plenum heat transfer chamber and communicates directly with said second outlet plenum on a second side of said second plenum heat transfer chamber, and
at least one heat transfer element is positioned within each of said second plenum heat transfer chambers.

9. A device as recited in claim 1, wherein:
said device further comprises at least a second outlet plenum and
each of said first plenum heat transfer chambers communicates directly with said second outlet plenum on a third side of said first plenum heat transfer chamber.

10. A device as recited in claim 9, wherein said first and second outlet plenums are positioned on opposite sides of said first inlet plenum.

11. A heat dissipation device, comprising:
a housing, said housing comprising a plurality of inlet plenums, comprising at least a first inlet plenum and a second inlet plenum, and a plurality of outlet plenums, comprising at least a first outlet plenum and a second outlet plenum,
said housing defining a plurality of heat transfer chambers, comprising at least a first heat transfer chamber and a second heat transfer chamber,
said first heat transfer chamber communicating directly with said first inlet plenum on a first side of said first heat transfer chamber and with said first outlet plenum on a second side of said first heat transfer chamber,
said second heat transfer chamber communicating directly with said second inlet plenum on a first side of said second heat transfer chamber and communicating directly with said second outlet plenum on a second side of said second heat transfer chamber; and
at least one heat transfer element positioned in each said heat transfer chamber, each said heat transfer element comprising a base and a plurality of protrusions,
said housing comprising a housing back wall, said housing back wall defining a plurality of back wall openings, each said heat transfer element being positioned with its base in contact with said housing back wall and its protrusions extending through one of said back wall openings, said base being on one side of said housing back wall and at least a portion of each of said protrusions being on an opposite side of said housing back wall.

12. A device as recited in claim 11, wherein:
said first inlet plenum extends in a first direction,
said first outlet plenum extends in a second direction, and
said first direction is substantially parallel to said second direction.

13. A device as recited in claim 11, wherein:
said first inlet plenum comprises at least a first inlet plenum first wall, a first inlet plenum second wall, a first inlet plenum third wall and a first inlet plenum fourth wall,
said first inlet plenum first wall extends substantially in a first inlet plenum first wall plane,
said first inlet plenum second wall extends substantially in a first inlet plenum second wall plane,
said first inlet plenum third wall extends substantially in a first inlet plenum third wall plane,
said first inlet plenum fourth wall extends substantially in a first inlet plenum fourth wall plane,
said first outlet plenum comprises at least a first outlet plenum first wall, a first outlet plenum second wall, a first outlet plenum third wall and a first outlet plenum fourth wall,
said first outlet plenum first wall extends substantially in a first outlet plenum first wall plane,
said first outlet plenum second wall extends substantially in a first outlet plenum second wall plane,
said first outlet plenum third wall extends substantially in a first outlet plenum third wall plane,
said first outlet plenum fourth wall extends substantially in a first outlet plenum fourth wall plane,
said first inlet plenum first wall is substantially parallel to said first outlet plenum first wall,
said first inlet plenum second wall is substantially parallel to said first outlet plenum second wall, said first inlet plenum third wall is substantially parallel to said first outlet plenum third wall, and said first inlet plenum fourth wall is substantially parallel to said first outlet plenum fourth wall.

14. A device as recited in claim 11, wherein each of said plurality of protrusions comprises a fin.

15. A device as recited in claim 11, wherein:
said first inlet plenum extends in a first direction, and
each of said protrusions extends in a direction substantially perpendicular to said first direction.

16. A device as recited in claim 11, wherein:
each of said protrusions extends from said base toward said first inlet plenum.

17. A device as recited in claim 11, wherein:
said base has a base first side and a base second side,
said protrusions extend from said base first side, and
at least one electronic component is mounted on said base second side.

18. A device as recited in claim 11, wherein:
said device further comprises at least a third heat transfer chamber,
said third heat transfer chamber contains at least one heat transfer element, and
said third heat transfer chamber communicates directly with said first inlet plenum on a first side of said third heat transfer chamber and communicates directly with said first outlet plenum on a second side of said third heat transfer chamber.

19. A device as recited in claim 18, wherein said first and second outlet plenums are positioned on opposite sides of said first inlet plenum.

20. A method of dissipating heat, comprising:
passing fluid through at least a first inlet plenum, then
passing said fluid across a plurality of protrusions of a heat transfer element, and then
passing said fluid through at least a first outlet plenum,
said heat transfer element being positioned within a heat transfer chamber,
said heat transfer chamber communicating directly with said first inlet plenum on a first side of said heat transfer chamber and communicating directly with said first outlet plenum on a second side of said heat transfer chamber,
said heat transfer element comprising a base and said plurality of protrusions,
said first inlet plenum and said first outlet plenum positioned within a housing,
said housing comprising a housing back wall, said housing back wall defining a plurality of back wall openings, each said heat transfer element being positioned with its base in contact with said housing back wall and its protrusions extending through one of said back wall openings, said base being on one side of said housing back wall and at least a portion of each of said protrusions being on an opposite side of said housing back wall.

21. A method as recited in claim 20, wherein said fluid is gaseous.

22. A method as recited in claim 20, wherein said fluid is air.

23. A method of dissipating heat, comprising:
passing fluid through at least a first inlet plenum, then
passing said fluid across a plurality of fins of a heat transfer element, and then
passing said fluid through at least a first outlet plenum,
said heat transfer element being positioned within a heat transfer chamber,
said heat transfer chamber communicating directly with said first inlet plenum on a first side of said heat transfer chamber and communicating directly with said first outlet plenum on a second side of said heat transfer chamber,
said heat transfer element comprising a base and said plurality of fins,
said first inlet plenum and said first outlet plenum positioned within a housing,
said housing comprising a housing back wall, said housing back wall defining a plurality of back wall openings, each said heat transfer element being positioned with its base in contact with said housing back wall and its fins extending through one of said back wall openings, said base being on one side of said housing back wall and at least a portion of each of said fins being on an opposite side of said housing back wall.

24. A method as recited in claim 23, wherein said fluid is gaseous.

25. A method as recited in claim 23, wherein said fluid is air.

26. A radar antenna, comprising:
a heat dissipation device as recited in claim 1; and
at least one radar electronic component mounted on said second base side.

27. A radar antenna as recited in claim 26, wherein:
said protrusions comprise at least one fin.

28. A radar antenna, comprising:
a heat dissipation device as recited in claim 11; and
at least one radar electronic component mounted on said second base side.

29. The device of claim 13 wherein a fluid flow impinges on said heat transfer element.

30. The device of claim 29 wherein the fluid flow only impinges once prior to exiting said outlet plenum.

31. A method as recited in claim 20, wherein said method further comprises metering said fluid.

32. A method as recited in claim 23, wherein said method further comprises metering said fluid.

* * * * *